United States Patent
Lee et al.

(10) Patent No.: US 8,461,591 B2
(45) Date of Patent: Jun. 11, 2013

(54) ORGANIC LIGHT EMITTING DISPLAY APPARATUS AND METHOD OF MANUFACTURING THE SAME

(75) Inventors: Yul-Kyu Lee, Yongin (KR); Chun-Gi You, Yongin (KR); Sun Park, Yongin (KR); Jong-Hyun Park, Yongin (KR); Jin-Hee Kang, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 261 days.

(21) Appl. No.: 12/954,544

(22) Filed: Nov. 24, 2010

(65) Prior Publication Data

US 2011/0121302 A1  May 26, 2011

(30) Foreign Application Priority Data

Nov. 24, 2009 (KR) .................. 10-2009-0114055

(51) Int. Cl.
  *H01L 29/04* (2006.01)
(52) U.S. Cl.
  USPC ............ 257/59; 438/149; 257/E29.117
(58) Field of Classification Search
  USPC ... 257/40, 59, 72, E29.117, E21.372; 438/49, 438/149
  See application file for complete search history.

(56) References Cited

U.S. PATENT DOCUMENTS

| | | | | |
|---|---|---|---|---|
| 7,550,771 | B2 * | 6/2009 | Nagata | 257/72 |
| 8,274,077 | B2 * | 9/2012 | Akimoto et al. | 257/43 |
| 2007/0024766 | A1 | 2/2007 | Song et al. | |
| 2007/0235777 | A1 | 10/2007 | Nagata | |

FOREIGN PATENT DOCUMENTS

| | | |
|---|---|---|
| JP | 2007-281155 | 10/2007 |
| KR | 10-2005-0047387 A | 5/2005 |
| KR | 10-2005-0105852 A | 11/2005 |
| KR | 10-2006-0057970 A | 5/2006 |
| KR | 10-20060058799 A | 6/2006 |
| KR | 10-2007-0001381 A | 1/2007 |
| KR | 10-2007-0014579 | 2/2007 |
| KR | 10-2007-0048446 | 5/2007 |
| KR | 10-2007-0056626 A | 6/2007 |
| KR | 10-2008-0037841 A | 5/2008 |

OTHER PUBLICATIONS

Office action dated Feb. 1, 2011 for corresponding Korean patent application No. 10-2009-0114055.

* cited by examiner

*Primary Examiner* — Quoc Hoang

(74) *Attorney, Agent, or Firm* — Christie, Parker & Hale, LLP

(57) ABSTRACT

An organic light emitting display device with a simplified manufacturing process and improved electrical characteristics, along with a method of manufacturing the device, are disclosed. The device includes: a substrate having a display area and a non-display area; a thin film transistor (TFT) in the display area; a wiring portion in the non-display area; an intermediate layer electrically connected to the TFT and including an organic light emitting layer; and a counter electrode on the intermediate layer. The TFT includes an active layer, a gate electrode, and source/drain electrodes electrically connected to the active layer. The source/drain electrodes include a first conductive layer, a second conductive layer, and a third conductive layer that are sequentially stacked. The wiring portion includes the same material as the first conductive layer. One of the source/drain electrodes is longer than the other, to function as a pixel electrode, and is electrically connected to the intermediate layer.

19 Claims, 9 Drawing Sheets

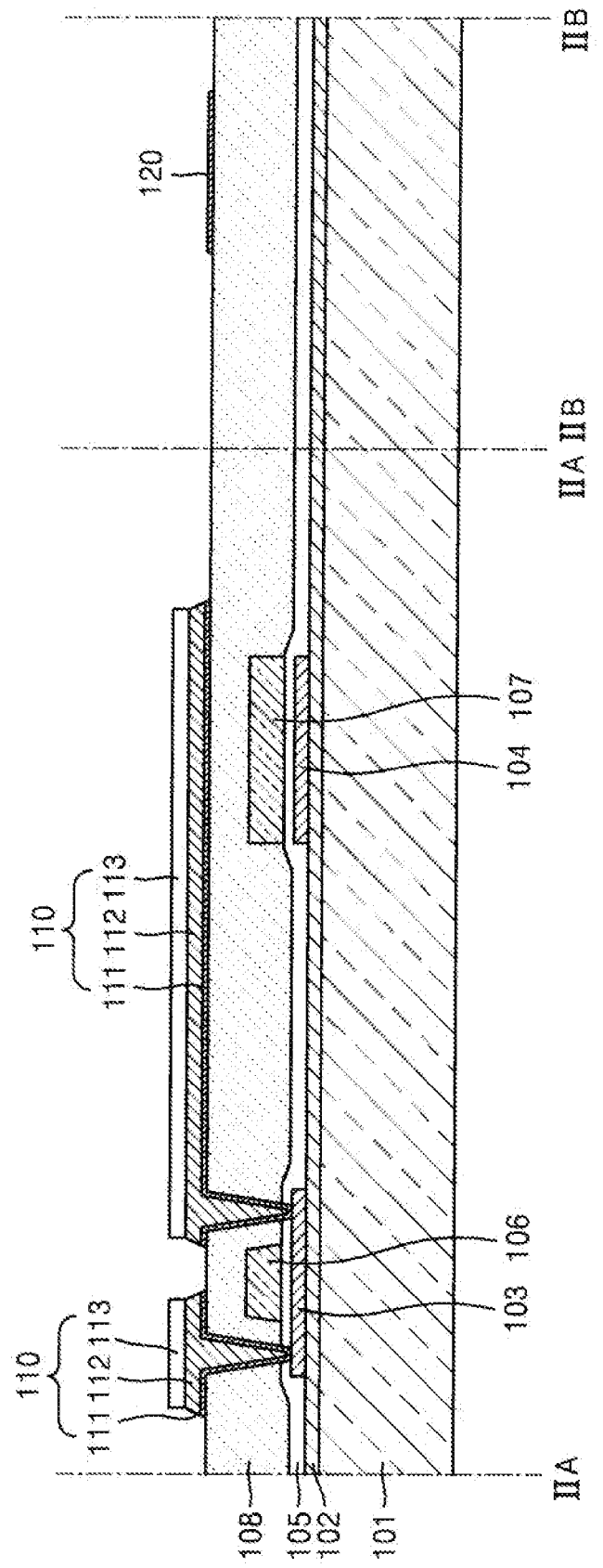

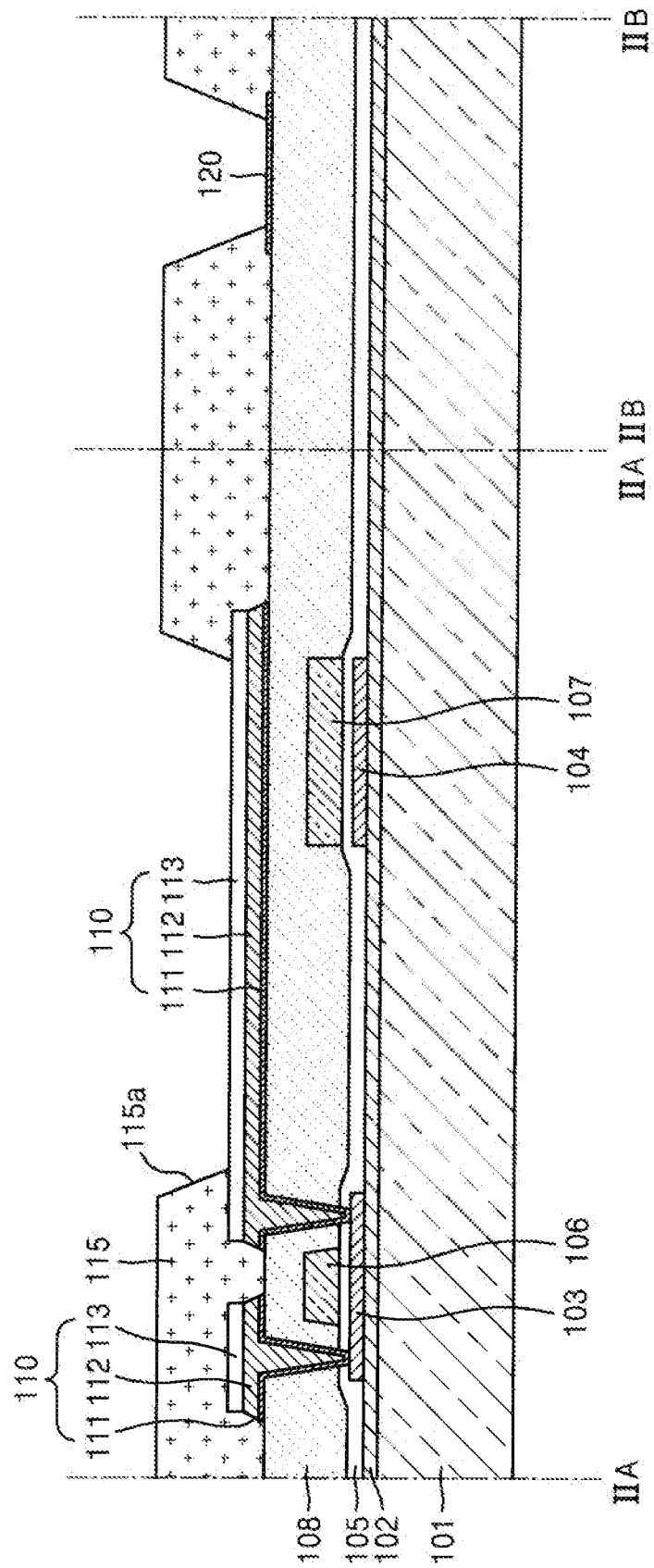

ORGANIC LIGHT EMITTING DISPLAY APPARATUS AND METHOD OF MANUFACTURING THE SAME

CROSS-REFERENCE TO RELATED APPLICATION

This application claims priority to and the benefit of Korean Patent Application No. 10-2009-0114055, filed in the Korean Intellectual Property Office on Nov. 24, 2009, the entire content of which is incorporated herein by reference.

BACKGROUND

1. Field

Aspects of embodiments according to the present invention relate to an organic light emitting display device and a method of manufacturing the same.

2. Description of Related Art

Developments in display technology have led to the replacement of conventional display devices with portable, thin, flat panel display devices. Among the flat panel display devices, electroluminescent (organic light emitting) display devices, which are self-emissive display devices, have a wide viewing angle, high contrast ratio, and high response speed, and thus have been considered as the next-generation display devices. In addition, organic light-emitting display devices having a light emitting layer formed of an organic material have improved properties in terms of brightness, driving voltage, and response speed, and can display more colors compared to inorganic light emitting display devices.

In an organic light emitting display device, a cathode electrode and an anode electrode are located around an organic light emitting layer. When a voltage is applied to the two electrodes, visible light is emitted from the organic light emitting layer connected to the electrodes.

The organic light emitting display device includes a plurality of thin films, and desired minute patterns are formed on the thin films. A number of processes are performed in order to form the minute patterns. The patterns are formed using various methods, for example, a photolithography method using a mask.

The photolithography method requires precise controlling. In addition, when forming patterns using a mask, a plurality of operations such as forming a photoresist, exposure, development, etching, etc., need to be performed. Accordingly, as the number of photolithography processes using the masks increases, a process of manufacturing the organic light emitting display device becomes more complicated, and the time for the processes increases. Accordingly, it becomes more difficult to control the processes, thereby increasing the number of defects.

In addition, as the thin films overlap, the total thickness of the organic light emitting display device increases, and thus it is difficult to realize a thin device as desired.

Also, various electrodes and wirings are included in the organic light emitting display devices, and the electrodes and wirings are formed of conductive thin films. Light emitting characteristics and electric characteristics of the organic light emitting display devices are likely to vary according to the configuration and materials of the electrodes and wirings.

SUMMARY

Aspects of embodiments according to the present invention provide an organic light emitting display device whose manufacturing processes may be simplified and electric characteristics may be improved, and a method of manufacturing the organic light emitting display device.

In an exemplary embodiment according to the present invention, an organic light emitting display device is disclosed. The organic light emitting display device includes a substrate, a thin film transistor, a wiring portion, an intermediate layer, and a counter electrode. The substrate has a display area and a non-display area. The thin film transistor is in the display area. The wiring portion is in the non-display area. The intermediate layer is electrically connected to the thin film transistor and includes an organic light emitting layer. The counter electrode is on the intermediate layer. The thin film transistor includes an active layer, a gate electrode, and source/drain electrodes. The gate electrode is insulated from the active layer. The source/drain electrodes are insulated from the gate electrode and electrically connected to the active layer. The source/drain electrodes include a first conductive layer, a second conductive layer, and a third conductive layer that are sequentially stacked. The wiring portion includes a same material as the first conductive layer. One of the source/drain electrodes is longer than an other of the source/drain electrodes, to function as a pixel electrode. The one of the source/drain electrodes and the intermediate layer are electrically connected to each other.

The organic light emitting display device may further include a pixel defining layer on the source/drain electrodes. The pixel defining layer has an opening portion. The intermediate layer is at the opening portion and contacts the one of the source/drain electrodes via the opening portion.

The first conductive layer may include Ti.

The second conductive layer may include Ag.

The third conductive layer may include at least one selected from the group including ITO, IZO, ZnO, and $In_2O_3$.

The organic light emitting display device may further include a planarization layer on the gate electrode that insulates the gate electrode from the source/drain electrodes. The source/drain electrodes are on the planarization layer.

The organic light emitting display device may further include a capacitor first electrode and a capacitor second electrode. The capacitor first electrode is in a same layer as the active layer and includes a same material as the active layer. The capacitor second electrode is insulated from the capacitor first electrode and above the capacitor first electrode. The capacitor second electrode is in a same layer as the gate electrode and includes a same material as the gate electrode. The capacitor second electrode corresponds to the capacitor first electrode.

The capacitor first electrode and the capacitor second electrode may be below the one of the source/drain electrodes.

In another exemplary embodiment according to the present invention, a method of manufacturing an organic light emitting display device on a substrate is provided. The substrate has a display area and a non-display area. The method includes: forming a thin film transistor in the display area; forming a wiring portion in the non-display area; forming an intermediate layer electrically connected to the thin film transistor and including an organic light emitting layer; and forming a counter electrode on the intermediate layer. The forming of the thin film transistor includes forming an active layer, forming a gate electrode insulated from the active layer, and forming source/drain electrodes that are insulated from the gate electrode and electrically connected to the active layer. The source/drain electrodes include a first conductive layer, a second conductive layer, and a third conductive layer that are sequentially stacked. The wiring portion includes a same material as the first conductive layer. One of the source/drain electrodes is longer than an other of the source/drain electrodes, to function as a pixel electrode. The one of the source/drain electrodes and the intermediate layer are electrically connected to each other.

The forming of the source/drain electrodes and the forming of the wiring portion may take place concurrently.

The method may further include forming a pixel defining layer including an opening portion, on the source/drain electrodes. The intermediate layer is at the opening portion and contacts the one of the source/drain electrodes via the opening portion.

The first conductive layer may include Ti.

The second conductive layer may include Ag.

The third conductive layer may include at least one selected from the group including ITO, IZO, ZnO, and $In_2O_3$.

The method may further include forming a planarization layer on the gate electrode. The planarization layer insulates the gate electrode from the source/drain electrodes. The source/drain electrodes are on the planarization layer.

The method may further include: forming a capacitor first electrode in a same layer as the active layer and of a same material as the active later; and forming a capacitor second electrode insulated from the capacitor first electrode and above the capacitor first electrode, in a same layer as the gate electrode and of a same material as the gate electrode, to correspond to the capacitor first electrode.

The capacitor first electrode and the capacitor second electrode may be below the one of the source/drain electrodes.

The forming of the active layer and the forming of the capacitor first electrode may take place concurrently.

The forming of the gate electrode and the forming of the capacitor second electrode may take place concurrently.

BRIEF DESCRIPTION OF THE DRAWINGS

The above and other features and aspects of the present invention will become more apparent by describing in detail exemplary embodiments thereof with reference to the attached drawings in which:

FIGS. 3A through 3G are cross-sectional views illustrating a method of manufacturing the organic light emitting display device of FIG. 1, according to an embodiment of the present invention.

DETAILED DESCRIPTION

Exemplary embodiments of the present invention will now be described more fully with reference to the accompanying drawings.

Figure 1:
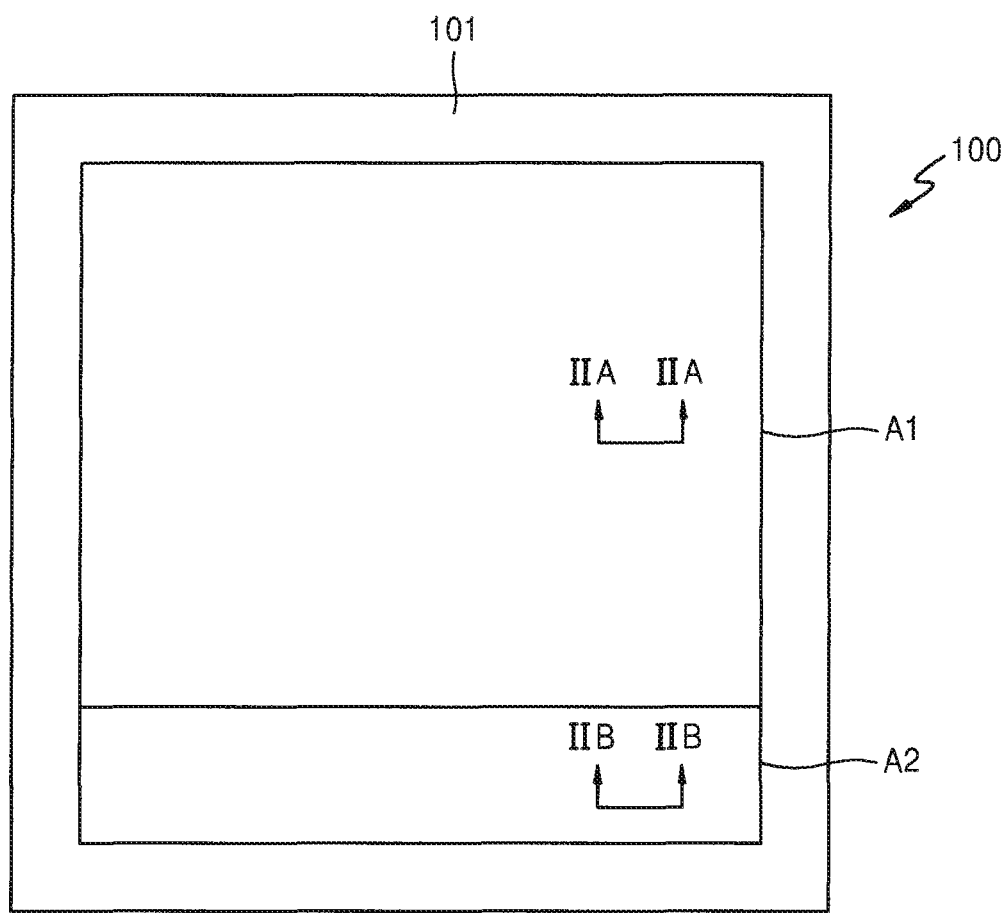
FIG. 1 is a plan view illustrating an organic light emitting display device according to an embodiment of the present invention.
Figure 2:
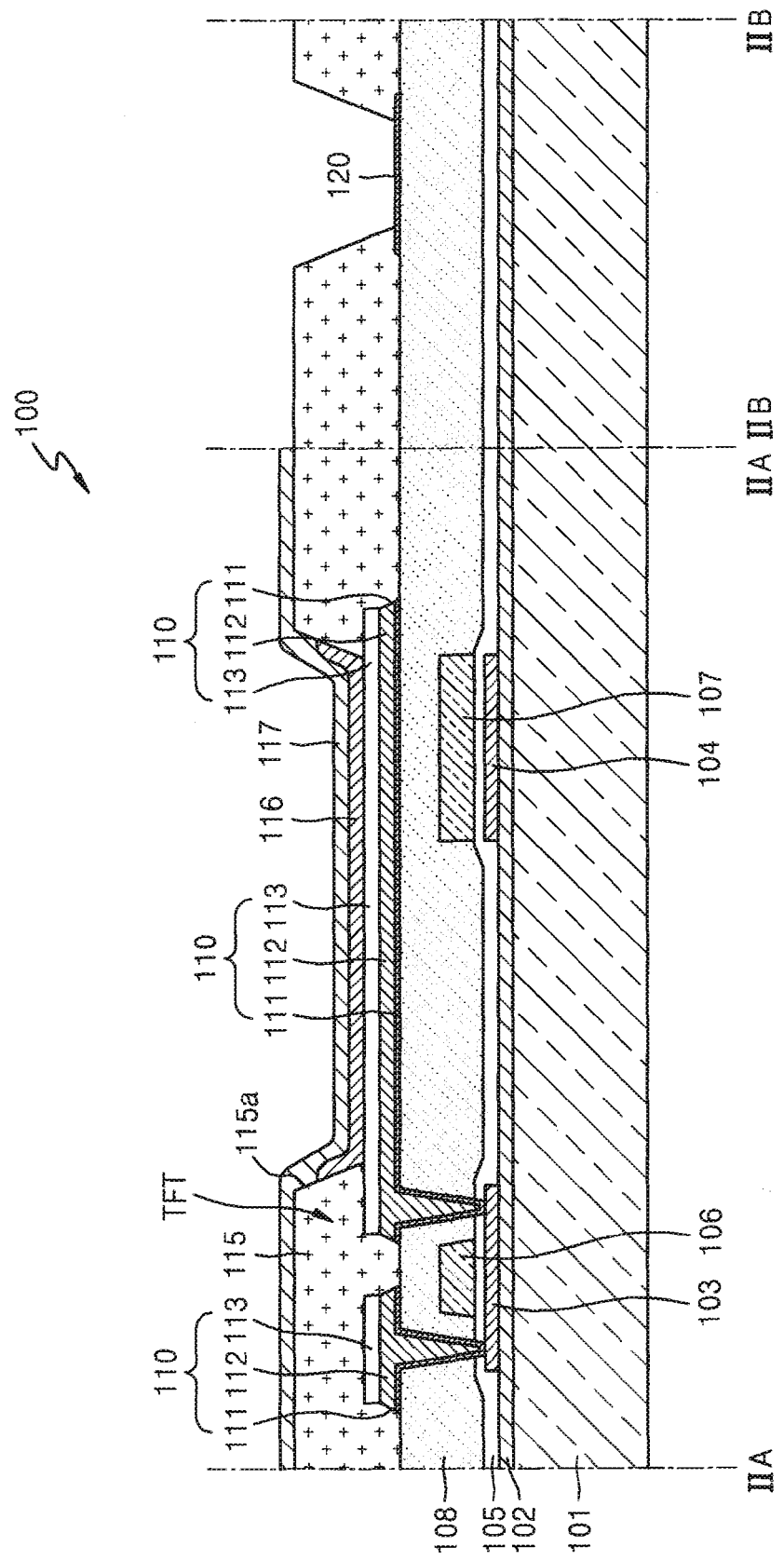
FIG. 2 is a cross-sectional view of the organic light emitting display device of FIG. 1 taken along a line IIA-IIA and a line IIB-IIB.

FIG. 1 is a plan view illustrating an organic light emitting display device 100 according to an embodiment of the present invention, and FIG. 2 is cross-sectional view of the organic light emitting display device 100 taken along a line IIA-IIA and a line IIB-IIB.

The organic light emitting display device 100 includes a display area A1 and a non-display area A2 defined on a substrate 101. In the display area A1, a plurality of pixels that emit visible light are located. An intermediate layer 116 including an organic light emitting layer, and a thin film transistor (TFT) are located in each pixel. For convenience of description, one pixel is illustrated with reference to a cross-sectional view of the organic light emitting display device 100 taken along a line IIA-IIA and a line IIB-IIB.

The non-display area A2 may be smaller than the display area A1, and the non-display area A2 is adjacent to the display area A1. In the non-display area A2, a wiring portion 120 that applies, for example, an electric signal or a voltage of a power source to the display area A1 is located. The wiring portion 120 is electrically connected to external circuits (not shown) in subsequent processes.

A TFT is formed in the display area A1. In FIG. 2, one TFT is illustrated, but the present invention is not limited thereto, and when necessary, a plurality of TFTs may also be included. The TFT includes an active layer 103, a gate electrode 106, and source/drain electrodes 110.

The configuration of elements of the organic light emitting display device 100 will be described in detail with reference to FIG. 2.

The substrate 101 may be formed of a transparent glass containing $SiO_2$ as a main component, but is not limited thereto, and thus may also be formed of a transparent plastic material that may be an insulating organic material selected from, for example, polyethersulphone (PES), polyacrylate (PAR), polyetherimide (PEI), polyethyelene napthalate (PEN), polyethyelene terephthalate (PET), polyphenylene sulfide (PPS), polyallylate, polyimide, polycarbonate (PC), triacetate cellulose (TAC), and cellulose acetate propionate (CAP).

In a bottom emission type organic light-emitting display device in which an image is displayed toward the substrate 101, the substrate 101 may be formed of a transparent material. However, in a top emission type organic light-emitting display device in which an image is displayed away from the substrate 101, the substrate 101 may be formed of a transparent or non-transparent material (for example, the substrate 101 may be formed of a metal). When the substrate 101 is formed of a metal, the substrate 101 may include at least one material selected from, for example, carbon (C), iron (Fe), chromium (Cr), manganese (Mg), nickel (Ni), titanium (Ti), molybdenum (Mo), stainless steel (SUS), Invar alloys, Inconel alloys, and Kovar alloys. However, the present invention is not limited to the above examples. For example, the substrate 101 may also be formed of a metal foil.

In order to form a planar surface on the substrate 101 and to prevent penetration of impurity elements onto the substrate 101, a buffer layer 102 may be formed on the substrate 101. The buffer layer 102 may, for example, be formed of $SiO_2$ and/or $SiN_x$.

The active layer 103 having a pattern (for example, a predetermined pattern) is formed on the buffer layer 102. The active layer 103 may be formed of an inorganic semiconductor, such as amorphous silicon or polysilicon, or an organic semiconductor, and includes a source region, a drain region, and a channel region.

The source and drain regions may be formed by doping the active layer 103 formed of amorphous silicon or polysilicon, with impurities. By doping a Group 3 element such as boron (B), a p-type semiconductor may be formed, and by doping a Group 5 element, an n-type semiconductor may be formed.

A capacitor first electrode 104 may be formed on the buffer layer 102 to be separated from the active layer 103. The capacitor first electrode 104 may be formed of an inorganic semiconductor, such as amorphous silicon or polysilicon, or an organic semiconductor.

A gate insulating layer 105 is formed on the active layer 103 and the capacitor first electrode 104, and a gate electrode 106 is formed on a region (for example, a predetermined region) of the gate insulating layer 105. The gate insulating layer 105 is for insulating the active layer 103 and the gate electrode 106 from each other, and may be formed of an organic material or an inorganic material such as $SiN_x$ or $SiO_2$.

The gate electrode 106 may, for example, be formed of a metal such as Au, Ag, Cu, Ni, Pt, Pd, Al, Mo, or a metal alloy such as an Al:Nd alloy, a Mo:W alloy, or the like, but are not limited thereto; the gate electrode 106 may also be formed using various materials in consideration of adhesion properties to adjacent layers, planarization characteristics of layers being stacked, electrical resistance, process complexity, etc. The gate electrode 106 is connected to a gate line (not shown) that applies a TFT on/off signal.

A capacitor second electrode 107 may be formed on the gate insulating layer 105 to correspond to the capacitor first electrode 104. The capacitor second electrode 107 may be formed of the same material as the gate electrode 106.

According to an embodiment of FIGS. 1 and 2, since the capacitor first electrode 104 and the capacitor second electrode 107, which are respectively formed on and under the gate insulating layer 105, are formed from the same layers as the active layer 103 and the gate electrode 107, respectively, a thickness of the organic light emitting display device 100 may be effectively reduced.

A planarization layer 108 including contact holes is formed on the gate electrode 106 and the capacitor second electrode 107. The planarization layer 108 may be formed of various insulating materials. For example, the planarization layer 108 may be formed of an inorganic material such as an oxide or a nitride, or of an organic material.

Examples of an inorganic insulating layer for forming the planarization layer 108 include $SiO_2$, $SiN_x$, SiON, $Al_2O_3$, $TiO_2$, $Ta_2O_5$, $HfO_2$, $ZrO_2$, BST, and PZT, and examples of an organic insulating layer for forming the planarization layer 108 include typical general-use polymers such as poly(methyl methacrylate) (PMMA), PS, a polymer derivative having a phenol group, an acrylic polymer, an amide polymer, an arylether polymer, an amide polymer, a fluoric polymer, a p-xylene polymer, a vinyl alcoholic polymer, and blends of these. The planarization layer 108 may also be formed of a composite stack including an inorganic insulating layer and an organic insulating layer.

The source/drain electrodes 110 are formed to contact the source and drain regions of the active layer 103 via the contact holes. One of the source/drain electrodes 110 is extended to be longer than the other to function as a pixel electrode.

The source/drain electrodes 110 include a first conductive layer 111, a second conductive layer 112, and a third conductive layer 113. The first conductive layer 111 may include Ti, which has excellent electric characteristics, durability, and excellent contacting characteristics to layers therebelow. The second conductive layer 112 is formed on the first conductive layer 111 and may include Ag to form a reflective metal layer. Ag has excellent reflection characteristics and may increase recombination efficiency inside the intermediate layer 116 due to light reflected by the second conductive layer 112. In addition, Ag has low electric resistance and a high melting point, and thus increases the total electric characteristics and durability of the source/drain electrodes 110.

The third conductive layer 113 is formed on the second conductive layer 112 and may be formed of a transmissive conductive layer, and may include at least one material having a high work function, selected from, for example, ITO, IZO, ZnO, and $In_2O_3$.

Since the source/drain electrodes 110 have a three-layer structure and the third conductive layer 113 includes a material having a high work function, one of the source/drain electrodes 110 may be a pixel electrode that functions as an anode electrode. Since this source/drain electrode 110 is longer than the other (to function as a pixel electrode), no additional pixel electrode is needed. Thus, the total thickness of the organic light emitting display device 100 may be reduced. In addition, the structure of the organic light emitting display device 100 may be further simplified, thereby minimizing or reducing a number of product defects and simplifying the manufacturing process.

Furthermore, an interlayer insulating layer for insulating the gate electrode 106 and the source/drain electrodes 110, and a passivation layer covering the source/drain electrodes 110 are not needed, as the planarization layer 108 is sufficient. Consequently, the thickness of the organic light emitting display device 100 may be further reduced and the structure thereof may be further simplified.

The wiring portion 120 is formed in on the planarization layer 108 in the non-display area A2. That is, the wiring portion 120 is formed of the same material as the first conductive layer 111 among the source/drain electrodes 110. That is, the wiring portion 120 includes Ti. The wiring portion 120 is formed on the same layer as the source/drain electrodes 110, and includes Ti having excellent electric characteristics and durability, thereby preventing damage in subsequent processes and improving the electric characteristics of the driving circuits. In addition, when the wiring portion 120 is formed of a plurality of conductive layers, water may penetrate through interfaces between the layers to thereby damage the wiring portion 120 and corrosion may be caused due to Galvanic effects due to potential differences between the layers. However, according to an embodiment of FIGS. 1 and 2, the wiring portion 120 is a single layer, and thus corrosion and damage due to water penetration or Galvanic effects are prevented.

A pixel defining layer 115 is formed on the source/drain electrodes 110 and the wiring portion 120. The pixel defining layer 115 is formed so that an upper surface of the one electrode that is longer than the other of the source/drain electrodes 110 (and functions as a pixel electrode) is exposed. In detail, an upper surface of the third conductive layer 113 is exposed. To this end, the pixel defining layer 115 includes an opening portion 115a. The pixel defining layer 115 may be formed of an organic material or an inorganic material.

An intermediate layer 116 including an organic light emitting layer is formed on the source/drain electrodes 110 exposed via the opening portion 115 formed in the pixel defining layer 115. In addition, a counter electrode 117 is formed on the intermediate layer 116. The counter electrode 117 may be formed to cover all of the pixels and may be a cathode electrode.

The intermediate layer 116 includes an organic light emitting layer that emits visible light. The intermediate layer 116 emits light as the source/drain electrodes 110 functioning as a pixel electrode and the counter electrode 117 are driven electrically.

The intermediate layer 116 may be formed of an organic material. When the organic light emitting layer is formed of a small molecule organic material, the intermediate layer 116 may have a stack structure in which a hole injection layer (HIL) and a hole transport layer (HTL) are stacked around an organic light emitting layer toward the source/drain electrodes 110 (e.g., the HIL and HTL are between the organic light emitting layer and the source/drain electrodes 110), and an electron transport layer (ETL) and an electron injection layer (EIL) are stacked toward the counter electrode 117 (e.g., the ETL and EIL are between the organic light emitting layer and the counter electrode 117). Examples of the organic material for the intermediate layer 116 include copper phthalocyanine (CuPc), N,N'-Di(naphthalene-1-yl)-N,N'-diphenyl-benzidine (NPB), tris-8-hydroxyquinoline aluminum (Alq3), etc.

When the organic light emitting layer of the intermediate layer 116 is formed of a polymer organic material, the intermediate layer 116 may have a structure formed in which only a HTL is formed around an organic light emitting layer toward the source/drain electrodes 110. The HTL formed of polymer may be formed of poly(3,4-ethylenedioxythiophene) (PEDOT) or polyaniline (PANI), and formed on the source/drain electrodes 110 by using an inkjet printing method or a spin coating method. The organic light emitting layer formed of polymer may be formed of soluble polyphenylenevinylene (PPV), cyano-PPV, polyfluorene or the like, and a color pattern may be formed in the organic light emitting layer using a method such as an inkjet printing method, a spin coating method, or a thermal transfer method such as laser.

The counter electrode 117 may be formed by depositing a metal having a small work function such as Ag, Mg, Al, Pt, Pd, Au, Ni, Nd, Ir, Cr, Li, Ca, and a compound of these, and then by depositing a transparent conductive material such as ITO, IZO, ZnO, or $In_2O_3$ thereon.

A sealing member (not shown) may be positioned to face a surface of the substrate 101. The sealing member (not shown) is formed, for example, to protect the intermediate layer 116 from water or oxygen from the outside, and is formed of a transparent material. To this end, the sealing member may be formed of glass, plastic, or have a structure in which a plurality of organic and inorganic materials are overlapped.

FIGS. 3A through 3G are cross-sectional views illustrating a method of manufacturing the organic light emitting display device 100 of FIG. 1, according to an embodiment of the present invention.

Figure 3A:
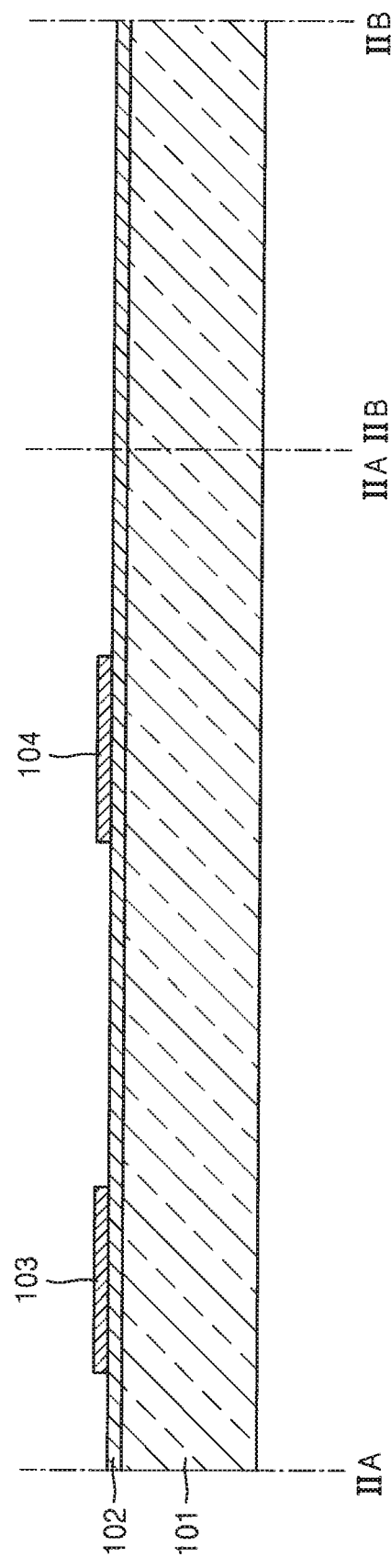

First, referring to FIG. 3A, a buffer layer 102 is formed on a substrate 101, and an active layer 103 and a capacitor first electrode 104 are formed on the buffer layer 102. The active layer 103 and the capacitor first electrode 104 are patterned to be separated from each other. After forming a thin film, the active layer 103 and the capacitor first electrode 104 may be formed at the same time (e.g., concurrently) by using a photolithography method using one mask.

Figure 3B:
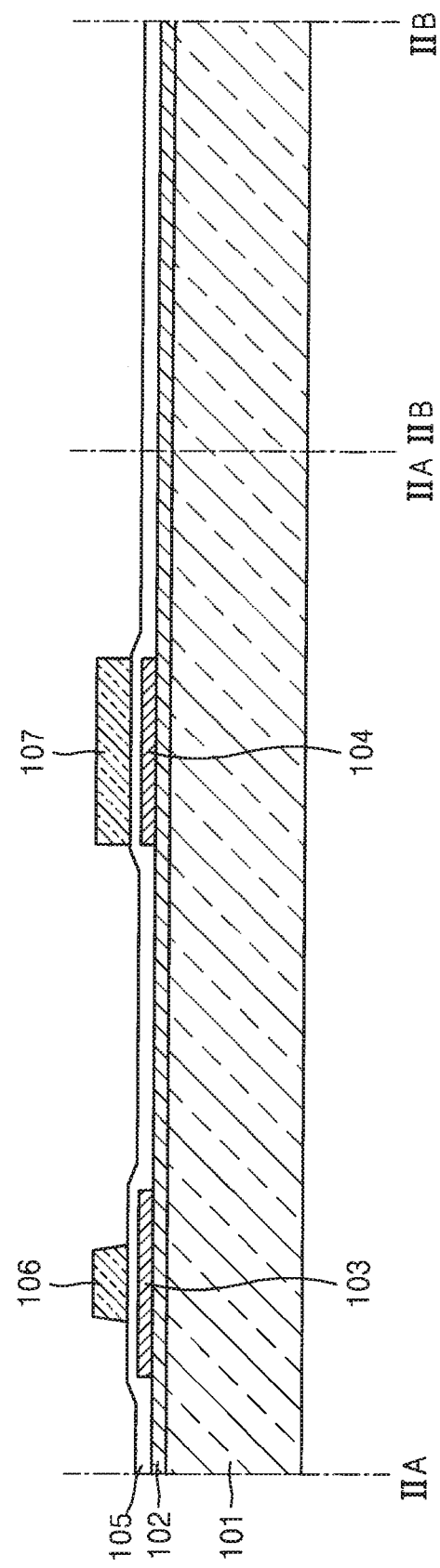

Then, referring to FIG. 3B, a gate insulating layer 105 is formed on the active layer 103 and the capacitor first electrode 104, and then a gate electrode 106 and a capacitor second electrode 107 are formed on the gate insulating layer 105. The gate electrode 106 and the capacitor second electrode 107 are patterned to be separated from each other. After forming a thin film, the gate electrode 106 and the capacitor second electrode 107 may be formed at the same time (e.g., concurrently) by using a photolithography method using one mask.

Figure 3C:
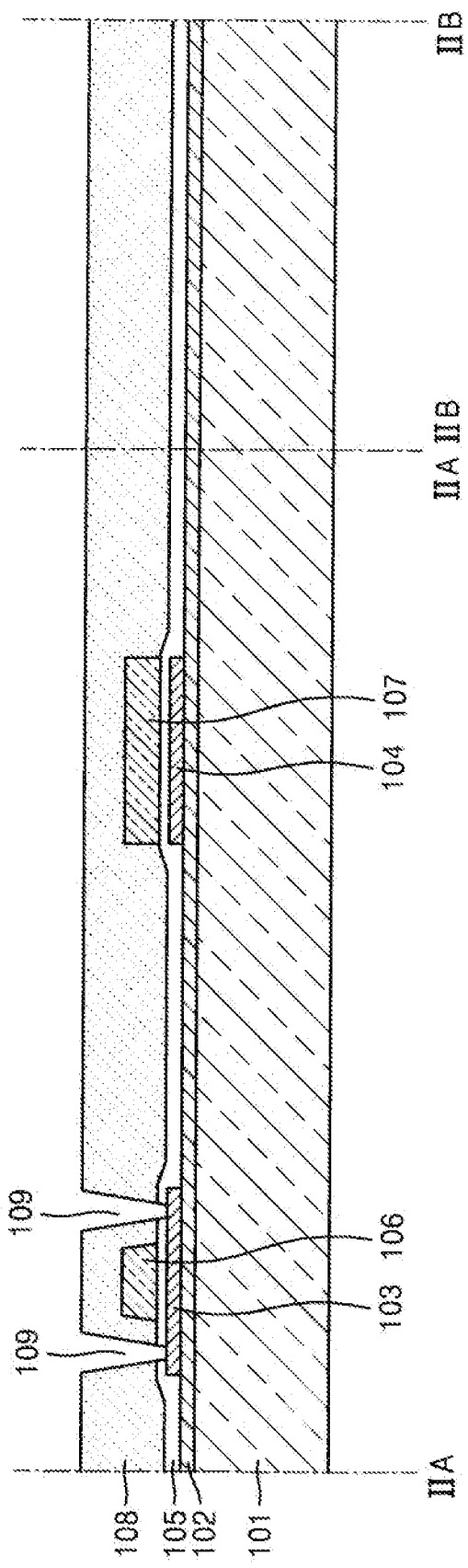

Then, referring to FIG. 3C, a planarization layer 108 is formed using an insulating material to cover the gate electrode 106 and the capacitor second electrode 107 and contact holes 109 are formed in the planarization layer 108. The contact holes 109 are formed in the planarization layer 108 so that a source region and a drain region of the active layer 103 are exposed. The contact holes may be formed using a photolithography method.

Figure 3D:
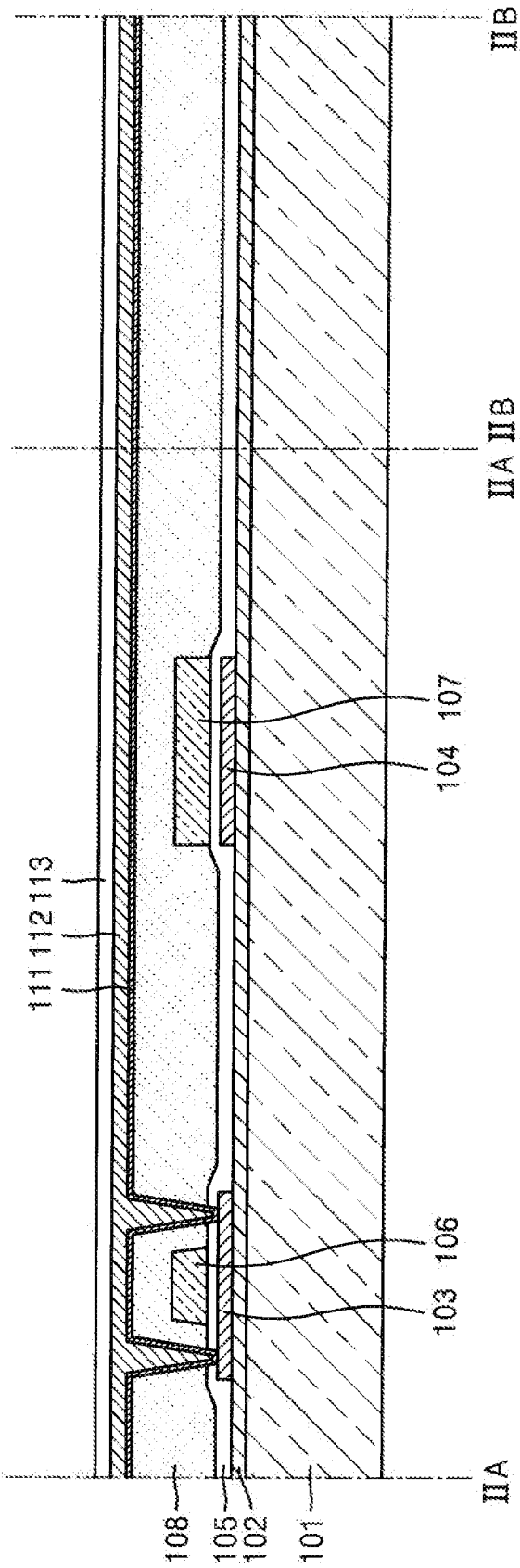

Then, referring to FIG. 3D, a first conductive layer 111, a second conductive layer 112, and a third conductive layer 113 are sequentially stacked on the planarization layer 108 and in the contact holes 109 (see FIG. 3C). The first conductive layer 111 has excellent electric characteristics and durability, and may include Ti, which has excellent adhesion characteristics to layers therebelow. The second conductive layer 112 is formed on the first conductive layer 111 and may include Ag to form a reflective metal layer. The third conductive layer 113 may be formed of a transmissive conductive layer, and may include at least one material having a high work function, selected from, for example, ITO, IZO, ZnO, and $In_2O_3$.

Then, referring to FIG. 3E, a patterning process is performed to pattern the first conductive layer 111, the second conductive layer 112, and the third conductive layer 113 to have a pattern (for example, a predetermined pattern), thereby forming source/drain electrodes 110 and a wiring portion 120. In detail, the source/drain electrodes 110 include the first conductive layer 111, the second conductive layer 112, and the third conductive layer 113, and the wiring portion 120 is formed of the same material as the first conductive layer 111.

The source/drain electrodes 110 and the wiring portion 120 may be patterned using a photolithography method using one mask, such as a halftone mask. A wet etching method may be used in the patterning process. In order to form the wiring portion 120, an etching solution that has better etching characteristics with respect to ITO, IZO, ZnO or $In_2O_3$ than with respect to Ti may be used to perform an etching process.

Then referring to FIG. 3F, a pixel defining layer 115 is formed on the source/drain electrodes 110. The pixel defining layer 115 includes an opening portion 115a, and an upper surface of one of the source/drain electrodes 110, which is extended to be longer than the other to function as a pixel electrode, is exposed through the opening portion 115a. In detail, the third conductive layer 113 is exposed.

Figure 3G:
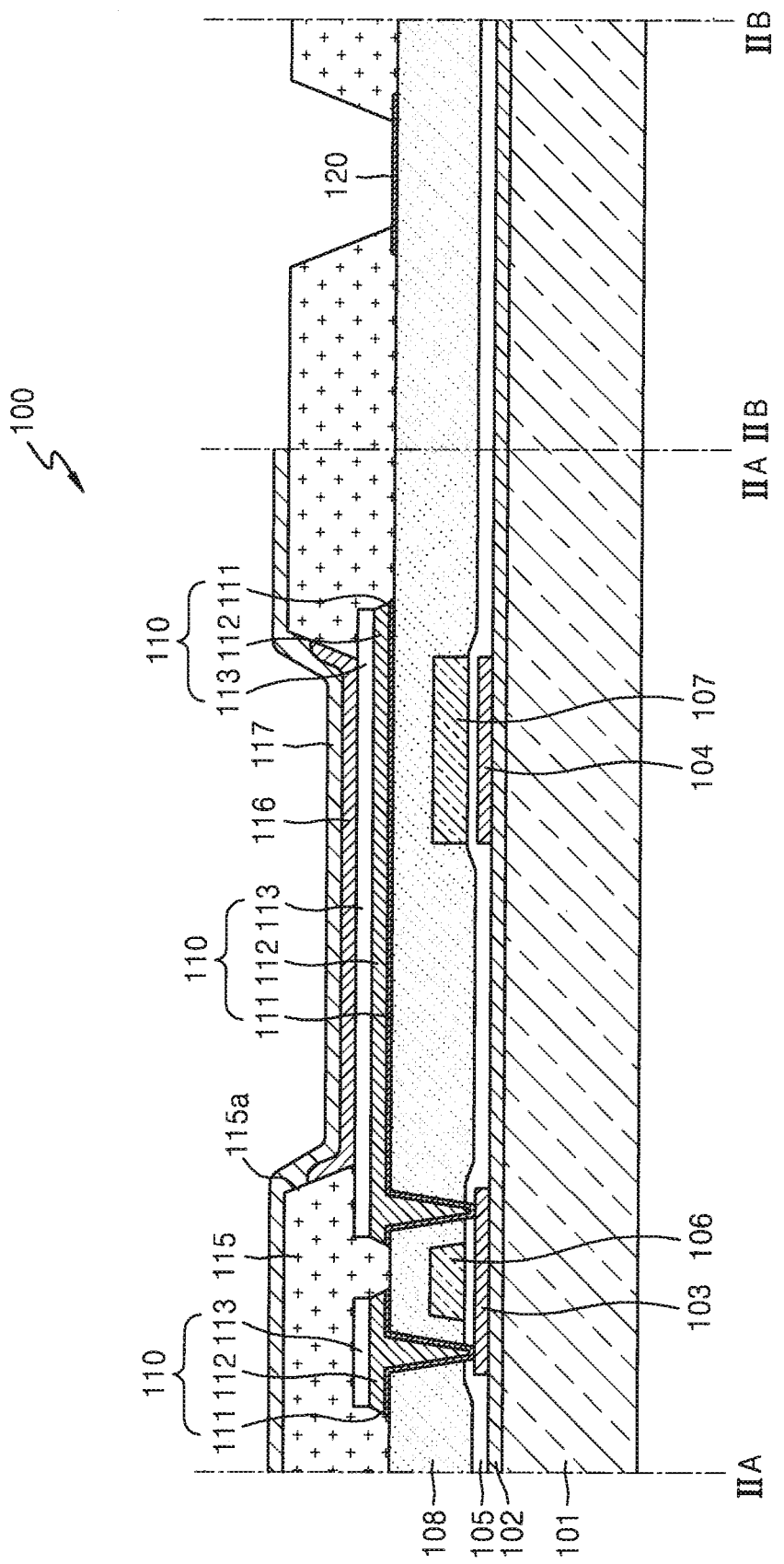

Then, referring to FIG. 3G, an intermediate layer 116 is formed on the third conductive layer 113 of the source/drain electrodes 110 exposed through the opening portion 115a of the pixel defining layer 115. The intermediate layer 116 includes an organic light emitting layer. A counter electrode 117 is formed on the intermediate layer 116, thereby completely manufacturing the organic light emitting display device 100. The materials for the intermediate layer 116 and the counter electrode 117 are the same as described above with reference to the previous embodiment, and thus description thereof will not be repeated.

Although not shown in the drawings, a sealing member (not shown) may be positioned to face a surface of the substrate 101. The sealing member (not shown) is formed to protect, for example, the intermediate layer 116 from water or oxygen from the outside, and is formed of a transparent material. To this end, the sealing member may be glass, plastic, or have a structure in which a plurality of organic materials and inorganic materials are overlapped.

According to embodiments of the present invention, since one of the source/drain electrodes functions as a pixel electrode, there is no need for a separate process for forming a pixel electrode. In particular, a photolithography method for patterning a pixel electrode is not required, and thus the manufacturing processes may be easily controlled and a defect ratio thereof may be significantly reduced. In addition, as thin films such as conductive layers or insulating layers for forming a pixel electrode are not required, the total thickness of the organic light emitting display device 100 may be reduced.

The source/drain electrodes 110 according to one embodiment of FIGS. 3A-3G include the first conductive layer 111, the second conductive layer 112, and the third conductive layer 113; the first conductive layer 111 includes Ti such that the electric characteristics and durability of the source/drain electrodes 110 and the adhesion characteristics of the source/drain electrodes 110 to the planarization layer 108 are improved. The second conductive layer 112 also includes Ag, thereby increasing a reflectivity in the source/drain electrodes 110. Visible light emitted from the organic light emitting layer of the intermediate layer 116 is reflected by the second conductive layer 112 and is directed toward the intermediate layer 116, thereby increasing a recombination efficiency in the intermediate layer 116. Consequently, the light emitting characteristics of the organic light emitting display device 100 may be improved.

In addition, according to embodiments of the present invention, the wiring portion 120 may be formed to include the same materials as the first conductive layer 111 at the same time with the source/drain electrodes 110. The wiring portion 120 includes Ti having excellent durability and electric characteristics and thus the durability and electric characteristics of the organic light emitting display device 100 are improved. Also, water penetration into various interfaces or corrosion caused due to Galvanic effects between the layers of the organic light emitting display device 100, which may be generated when the wiring portion 120 is formed of a plurality of layers, may be prevented.

Further, according to embodiments of the present invention, the capacitor first electrode 104 and the capacitor second electrode 107 may be more easily formed without using an additional mask. In addition, by forming the capacitor first electrode 104 in the same layer as the active layer 103 and the capacitor second electrode 107 in the same layer as the gate electrode 106, separate layers for the capacitor first and second electrodes 104 and 107 are not needed, and thus the total thickness of the organic light emitting display device 100 is not increased.

Also, the capacitor first electrode 104 and the capacitor second electrode 107 are formed below the electrode among the source/drain electrodes 110 that functions as a pixel electrode. Thus, reduction in an aperture ratio and luminance in a top emission type organic light emitting display device in which an image is displayed away from the substrate 101 may be prevented.

According to embodiments of the organic light emitting display device and the method of manufacturing the organic light emitting display device of the present invention, the manufacturing processes may be simplified and electric characteristics of the organic light emitting display device may be improved.

While the present invention has been particularly shown and described with reference to exemplary embodiments thereof, it will be understood by those of ordinary skill in the art that various changes in form and details may be made therein without departing from the spirit and scope of the present invention as defined by the following claims, and equivalents thereof.

What is claimed is:

1. An organic light emitting display device comprising:
a substrate having a display area and a non-display area;
a thin film transistor in the display area;
a wiring portion in the non-display area;
an intermediate layer electrically connected to the thin film transistor and comprising an organic light emitting layer; and
a counter electrode on the intermediate layer,
wherein the thin film transistor comprises an active layer, a gate electrode insulated from the active layer, and source/drain electrodes that are insulated from the gate electrode and electrically connected to the active layer,
wherein the source/drain electrodes comprise a first conductive layer, a second conductive layer, and a third conductive layer that are sequentially stacked,
wherein the wiring portion comprises a same material as the first conductive layer and a different material from the second conductive layer and the third conductive layer,
wherein one of the source/drain electrodes is longer than an other of the source/drain electrodes, to function as a pixel electrode, and
wherein the one of the source/drain electrodes and the intermediate layer are electrically connected to each other.

2. The organic light emitting display device of claim 1, further comprising a pixel defining layer having an opening portion, on the source/drain electrodes, wherein the intermediate layer is at the opening portion and contacts the one of the source/drain electrodes via the opening portion.

3. The organic light emitting display device of claim 1, wherein the first conductive layer comprises Ti.

4. The organic light emitting display device of claim 1, wherein the third conductive layer comprises at least one selected from the group consisting of ITO, IZO, ZnO, and $In_2O_3$.

5. The organic light emitting display device of claim 1, further comprising:
a capacitor first electrode in a same layer as the active layer and comprising a same material as the active layer; and
a capacitor second electrode insulated from the capacitor first electrode and above the capacitor first electrode, in a same layer as the gate electrode and comprising a same material as the gate electrode, to correspond to the capacitor first electrode.

6. The organic light emitting display device of claim 5, wherein the capacitor first electrode and the capacitor second electrode are below the one of the source/drain electrodes.

7. An organic light emitting display device comprising:
a substrate having a display area and a non-display area;
a thin film transistor in the display area;
a wiring portion in the non-display area;
an intermediate layer electrically connected to the thin film transistor and comprising an organic light emitting layer; and
a counter electrode on the intermediate layer,
wherein the thin film transistor comprises an active layer, a gate electrode insulated from the active layer, and source/drain electrodes that are insulated from the gate electrode and electrically connected to the active layer,
wherein the source/drain electrodes comprise a first conductive layer, a second conductive layer, and a third conductive layer that are sequentially stacked,
wherein the wiring portion comprises a same material as the first conductive layer,
wherein one of the source/drain electrodes is longer than an other of the source/drain electrodes, to function as a pixel electrode,
wherein the one of the source/drain electrodes and the intermediate layer are electrically connected to each other, and
wherein the second conductive layer comprises Ag.

8. An organic light emitting display device comprising:
a substrate having a display area and a non-display area;
a thin film transistor in the display area;
a wiring portion in the non-display area;
an intermediate layer electrically connected to the thin film transistor and comprising an organic light emitting layer; and
a counter electrode on the intermediate layer,
wherein the thin film transistor comprises an active layer, a gate electrode insulated from the active layer, and source/drain electrodes that are insulated from the gate electrode and electrically connected to the active layer, wherein the source/drain electrodes comprise a first conductive layer, a second conductive layer, and a third conductive layer that are sequentially stacked, wherein the wiring portion comprises a same material as the first conductive layer, wherein one of the source/drain electrodes is longer than an other of the source/drain electrodes, to function as a pixel electrode, wherein the one of the source/drain electrodes and the intermediate layer are electrically connected to each other, wherein the organic light emitting display device further comprises a planarization layer on the gate electrode that insulates the gate electrode from the source/drain electrodes, and wherein the source/drain electrodes are on the planarization layer.

9. A method of manufacturing an organic light emitting display device on a substrate having a display area and a non-display area, the method comprising:

forming a thin film transistor in the display area;

forming a wiring portion in the non-display area;

forming an intermediate layer electrically connected to the thin film transistor and comprising an organic light emitting layer; and forming a counter electrode on the intermediate layer, wherein the forming of the thin film transistor comprises forming an active layer, forming a gate electrode insulated from the active layer, and forming source/drain electrodes that are insulated from the gate electrode and electrically connected to the active layer, wherein the source/drain electrodes comprise a first conductive layer, a second conductive layer, and a third conductive layer that are sequentially stacked, wherein the wiring portion comprises a same material as the first conductive layer and a different material from the second conductive layer and the third conductive layer, wherein one of the source/drain electrodes is longer than an other of the source/drain electrodes, to function as a pixel electrode, and wherein the one of the source/drain electrodes and the intermediate layer are electrically connected to each other.

10. The method of claim 9, wherein the forming of the source/drain electrodes and the forming of the wiring portion take place concurrently.

11. The method of claim 9, further comprising forming a pixel defining layer comprising an opening portion, on the source/drain electrodes, wherein the intermediate layer is at the opening portion and contacts the one of the source/drain electrodes via the opening portion.

12. The method of claim 9, wherein the first conductive layer comprises Ti.

13. The method of claim 9, wherein the third conductive layer comprises at least one selected from the group consisting of ITO, IZO, ZnO, and $In_2O_3$.

14. The method of claim 9, further comprising:

forming a capacitor first electrode in a same layer as the active layer and of a same material as the active layer; and forming a capacitor second electrode insulated from the capacitor first electrode and above the capacitor first electrode, in a same layer as the gate electrode and of a same material as the gate electrode, to correspond to the capacitor first electrode.

15. The method of claim 14, wherein the capacitor first electrode and the capacitor second electrode are below the one of the source/drain electrodes.

16. The method of claim 14, wherein the forming of the active layer and the forming of the capacitor first electrode take place concurrently.

17. The method of claim 14, wherein the forming of the gate electrode and the forming of the capacitor second electrode take place concurrently.

18. A method of manufacturing an organic light emitting display device on a substrate having a display area and a non-display area, the method comprising:

forming a thin film transistor in the display area;

forming a wiring portion in the non-display area;

forming an intermediate layer electrically connected to the thin film transistor and comprising an organic light emitting layer; and forming a counter electrode on the intermediate layer, wherein the forming of the thin film transistor comprises forming an active layer, forming a gate electrode insulated from the active layer, and forming source/drain electrodes that are insulated from the gate electrode and electrically connected to the active layer, wherein the source/drain electrodes comprise a first conductive layer, a second conductive layer, and a third conductive layer that are sequentially stacked, wherein the wiring portion comprises a same material as the first conductive layer, wherein one of the source/drain electrodes is longer than an other of the source/drain electrodes, to function as a pixel electrode, and wherein the one of the source/drain electrodes and the intermediate layer are electrically connected to each other, and wherein the second conductive layer comprises Ag.

19. A method of manufacturing an organic light emitting display device on a substrate having a display area and a non-display area, the method comprising:

forming a thin film transistor in the display area;

forming a wiring portion in the non-display area;

forming an intermediate layer electrically connected to the thin film transistor and comprising an organic light emitting layer; and forming a counter electrode on the intermediate layer, wherein the forming of the thin film transistor comprises forming an active layer, forming a gate electrode insulated from the active layer, and forming source/drain electrodes that are insulated from the gate electrode and electrically connected to the active layer, wherein the source/drain electrodes comprise a first conductive layer, a second conductive layer, and a third conductive layer that are sequentially stacked, wherein the wiring portion comprises a same material as the first conductive layer, wherein one of the source/drain electrodes is longer than an other of the source/drain electrodes, to function as a pixel electrode, and wherein the one of the source/drain electrodes and the intermediate layer are electrically connected to each other, wherein the method further comprises forming a planarization layer on the gate electrode that insulates the gate electrode from the source/drain electrodes, and wherein the source/drain electrodes are on the planarization layer.

* * * * *